US 6,653,188 B1

(12) United States Patent
Huang et al.

(10) Patent No.: US 6,653,188 B1
(45) Date of Patent: Nov. 25, 2003

(54) METHOD OF FORMING POLY TIP OF FLOATING GATE IN SPLIT-GATE MEMORY

(75) Inventors: Yung-Meng Huang, Taipei (TW); Chi-Hei Lin, Taipei (TW); Ching-Nan Hsiao, Kaohsiung (TW)

(73) Assignee: Nanya Technology Corp., Taoyuan (TW)

( * ) Notice: Subject to any disclaimer, the term of this patent is extended or adjusted under 35 U.S.C. 154(b) by 0 days.

(21) Appl. No.: 10/292,624

(22) Filed: Nov. 13, 2002

(30) Foreign Application Priority Data

May 8, 2002 (TW) ........................................ 91109603 A

(51) Int. Cl.[7] ............................................ H01L 21/336
(52) U.S. Cl. .................... 438/257; 438/259; 438/593; 257/E29.129
(58) Field of Search ................. 438/257, 259, 438/593, FOR 203; 257/E29.129

(56) References Cited

U.S. PATENT DOCUMENTS 6,093,945 A * 7/2000 Yang ........................... 257/317
6,204,126 B1 * 3/2001 Hsieh et al. .................. 438/267

* cited by examiner

Primary Examiner—George Fourson
Assistant Examiner—Thanh V Pham
(74) Attorney, Agent, or Firm—Nixon Peabody LLP; Donald R. Studebaker

(57) ABSTRACT

The present invention provides a method for forming a floating gate with a poly tip. The method includes the step of providing a semiconductor substrate with a gate dielectric layer formed on the semiconductor substrate. A first polysilicon layer is then formed on the gate dielectric layer. A hard mask layer is formed on the first polysilicon layer. Then, an opening is formed in the hard mask layer to expose a portion of the first polysilicon layer. Next, a poly spacer is formed in the opening. Then, the hard mask layer and the first polysilicon layer thereunder are removed to form the floating gate.

17 Claims, 5 Drawing Sheets

US 6,653,188 B1

METHOD OF FORMING POLY TIP OF FLOATING GATE IN SPLIT-GATE MEMORY

CROSS REFERENCE TO RELATED APPLICATIONS

This application claims priority to Taiwan Patent Application No. 091109603 entitled "Method for Forming Poly Tip of Floating Gate in Split Gate Flash Memory", filed May 8, 2002.

FIELD OF INVENTION

The present invention generally relates to a method of forming floating gate, and more particularly, to a method of forming a poly tip of floating gate in a split-gate memory.

BACKGROUND OF THE INVENTION

The structure of a flash memory cell is classified into two types, a stacked-gate structure and a split-gate structure. Due to the over-erasure phenomenon, the stacked-gate transistor easily becomes a depletion transistor, which conducts even in absence of the application of a control voltage at the control gate. The split-gate memory is devised to overcome the over-erasure problem of the stacked-gate type memory.

Referring to FIG. 1, a split-gate memory device 10 includes a floating gate 12 covering a portion of the channel region. The control gate 14 directly controls the rest of the channel. When memory cells are arranged in such configuration, the transistor solely controlled by the control gate 14 is free from influence of the state of floating gate 12. Therefore, the memory cell can maintain its correct state irrespective of the over-erasure problem.

The speed of programming and erasing a flash memory device is an important criterion for the performance of a memory device. A faster erase speed is achieved if the coupling ratio between the control gate and the floating gate is low. In other words, by having a thinner. floating gate as well as a sharper edge on the gate, the erase speed is increased. Therefore, forming a floating gate with sharp poly tip is a desire approach of developing the split-gate flash memory.

As shown in FIG. 1, the method for forming a conventional floating gate tip includes the step of sequentially forming a gate oxide layer 18, a polysilicon layer 12 serving as the floating gate, and a silicon nitride layer on a silicon substrate 16. Then, by ways of photolithography and etch techniques, an opening defining the floating gate is formed in the nitride layer. The key aspect of the conventional method is the thermal oxidation of the polysilicon layer 12 to form a silicon oxide layer 20. Then, the nitride layer and the polysilicon layer 12 thereunder are removed by using the silicon oxide layer 20 as an etching mask. In the subsequent steps, an interpoly oxide layer 22 and the control gate 14 are formed to complete the formation of the split-gate memory 10.

Due to the utilization of thermal oxidation to form the oxide layer, which is removed in a later step, the conventional floating gate tip shape is determined by the oxidation of the polysilicon layer 20. Therefore, there is a need to provide a method of forming a shaper tip or a tip with well-controlled shape to increase the erase speed of a split-gate flash memory device.

OBJECTS AND SUMMARY OF THE INVENTION

One aspect of the present invention is to provide a method of forming a poly tip of a floating gate to increase the erase speed of a split-gate memory.

It is another aspect of the present invention that a method of forming a floating gate tip is provided, which employs a poly spacer to form a shaper and better-controlled tip.

It is a further aspect of the present invention that a method for forming a floating gate tip is provided, which forms a spacer for better control of the tip shape and the process parameters.

The method includes the step of providing a semiconductor substrate with a gate dielectric layer formed on the semiconductor substrate. A first polysilicon (or poly) layer is then formed on the gate dielectric layer. A hard mask layer is formed on the first polysilicon layer. Then, an opening is formed in the hard mask layer to expose a portion of the first polysilicon layer. Next, a poly spacer is formed in the opening. Then, the hard mask layer and the first polysilicon layer thereunder are removed to form the floating gate.

The method further includes the step of thermal oxidizing the first polysilicon layer and the poly spacer to sharpen the poly spacer. The method further includes the step of forming an interpoly insulating layer and a control gate layer to form a split-gate flash memory.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

The present invention discloses a method for forming a floating gate tip to increase the erase speed of a split-gate flash memory. FIGS. 2 to 10 illustrate a preferred embodiment of the present invention.

Figure 1:
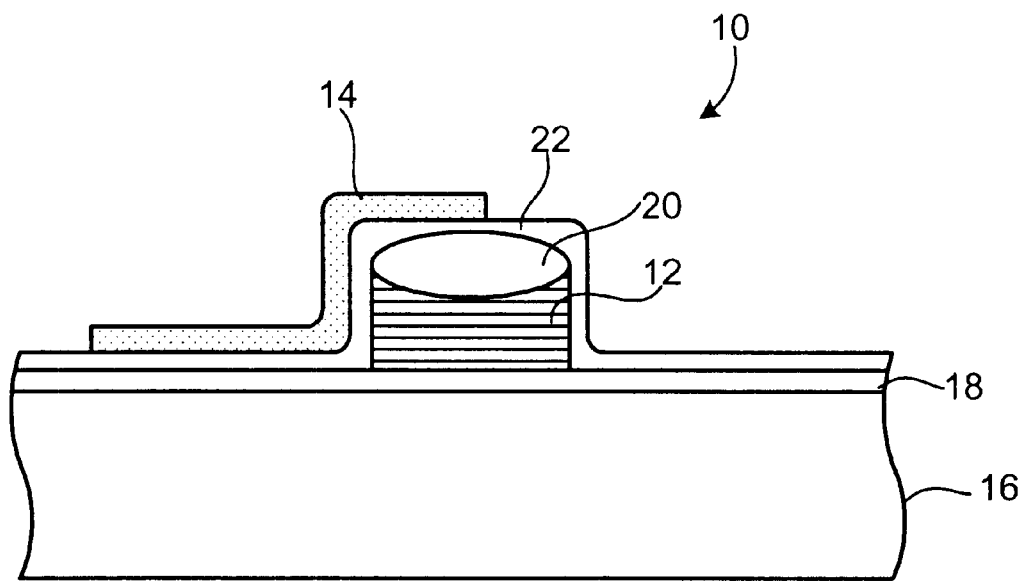
FIG. 1 illustrates a cross-sectional view of a conventional split-gate flash memory.
Figure 2:
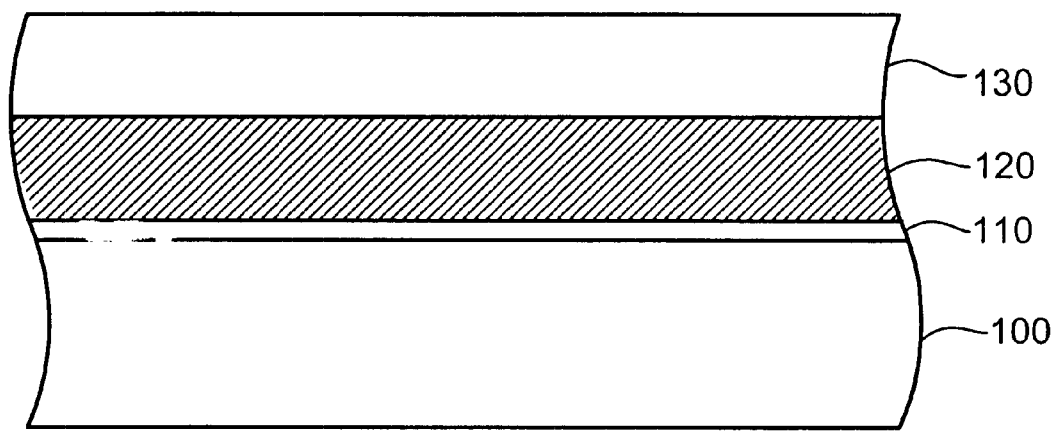
FIG. 2 illustrates a cross-sectional view of a hard mask layer formed on a gate dielectric layer in accordance with the present invention.

Referring to FIG. 2, in an embodiment of the present invention, the method includes the step of providing a semiconductor substrate 100, such as a silicon substrate. A gate dielectric layer 110, such as a silicon oxide layer, is then formed on the silicon substrate 100. The formation of the gate oxide layer 110 includes thermal oxidizing the silicon substrate 100 or depositing by low pressure chemical vapor deposition (LPCVD) process to form a silicon oxide layer 110 with-a thickness between about 70 to 90 angstroms (Å). Then, the first polysilicon layer 120 is formed on the gate oxide layer 110. The preferred thickness of the first polysilicon layer 120 is between about 400 to 600 angstroms (Å). A hard mask layer 130 is then formed on the first polysilicon layer 120. The hard mask layer 130 is a nitride layer or any other layer, which has a different etching selectivity relative to other subsequent layers. The preferred thickness of the hard mask layer 130 is between about 300 to 1000 angstroms (Å).

Figure 3:
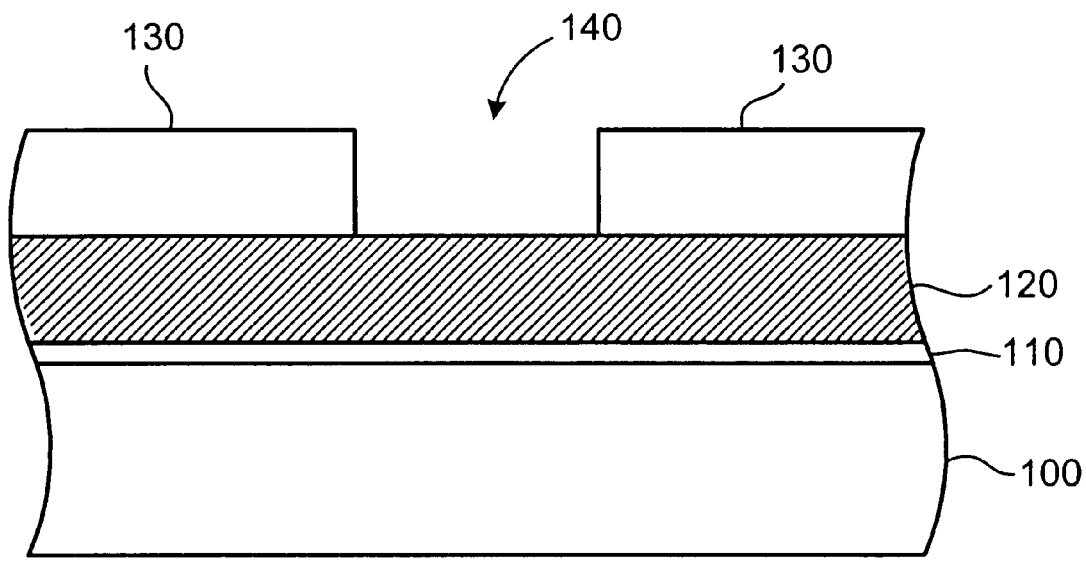
FIG. 3 illustrates a cross-sectional view of an opening formed on the hard mask layer in accordance with the present invention.

Then, a patterned photoresist layer (not shown) is formed on the nitride layer 130 by a conventional technique. The patterned photoresist layer defines an opening on the hard mask layer 130. In other words, the opening of the patterned photoresist layer defines where a floating gate is to be formed. By using the patterned photoresist layer as a mask, the nitride layer 130 is etched to expose a portion of the first polysilicon layer 120 and to form an opening 140 in the nitride laycr 130. Then, the patterned photoresist layer 130 is removed, as shown in FIG. 3.

Figure 4:
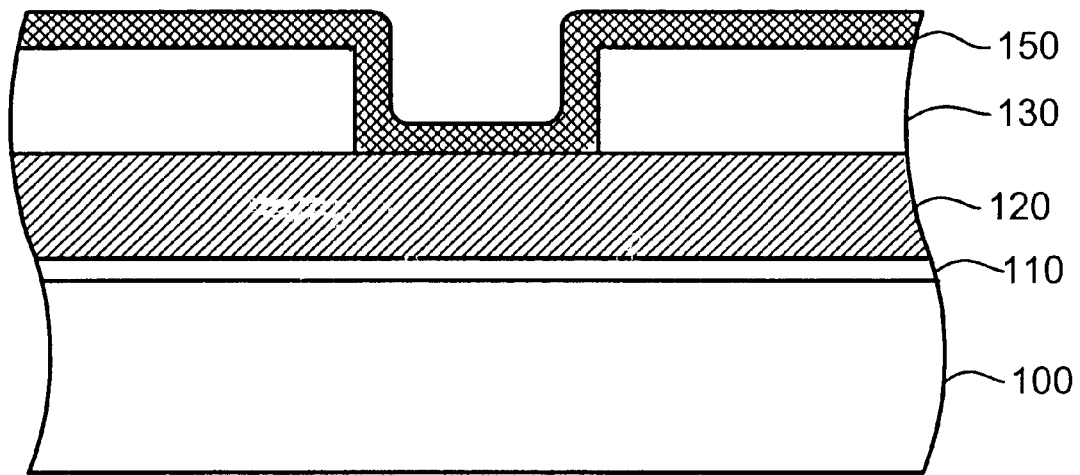
FIG. 4 illustrates a cross-sectional view of forming a conformal polysilicon layer in accordance with the present invention.
Figure 5:
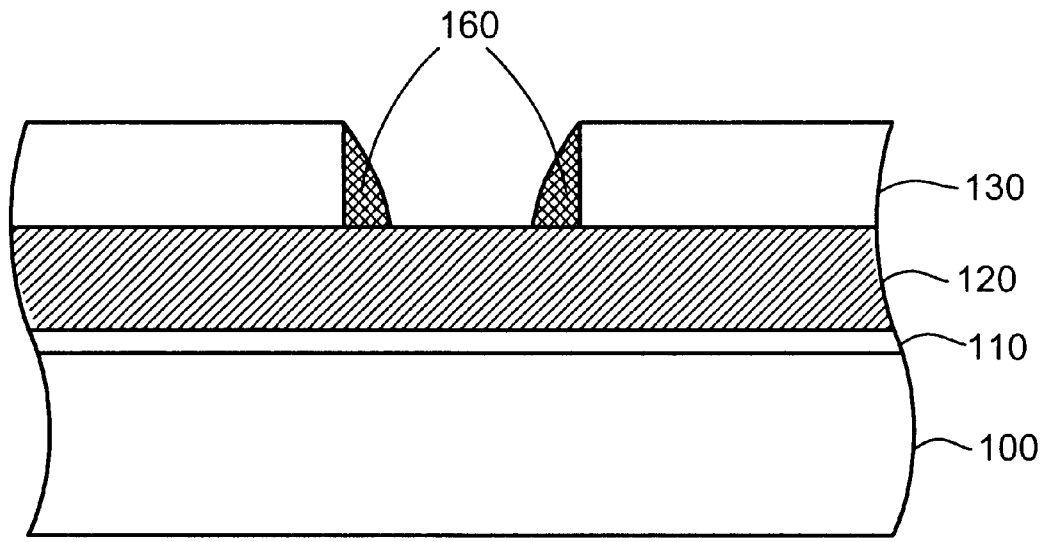
FIG. 5 illustrates a cross-sectional view of a poly spacer in the opening in accordance with the present invention.

Referring to FIG. 4, a conformal polysilicon layer 150 is formed on the nitride layer 130. It is noted that, in the formation of the opening 140, the nitride layer 130 is usually over-etched to ensure the conformal polysilicon layer 150 is electrically coupled to the first polysilicon layer 120. Next, the conformal polysilicon layer 150 is etched to form a poly spacer 160 in the opening 140, as illustrated in FIG. 5. It is noted that the thicknesses of the hard mask layer 130 and the conformal poly layer 150 are critical to the shape of tip (or the poly spacer 160). When the thickness of hard mask layer 130 gets thicker, the tip 160 becomes longer (or higher). When the thickness of conformal poly layer 150 gets thinner, the tip 160 becomes narrower (or sharper). Therefore, by controlling the thicknesses of the hard mask layer 130 and the conformal poly layer 150, the tip shape is well controlled.

Figure 6:
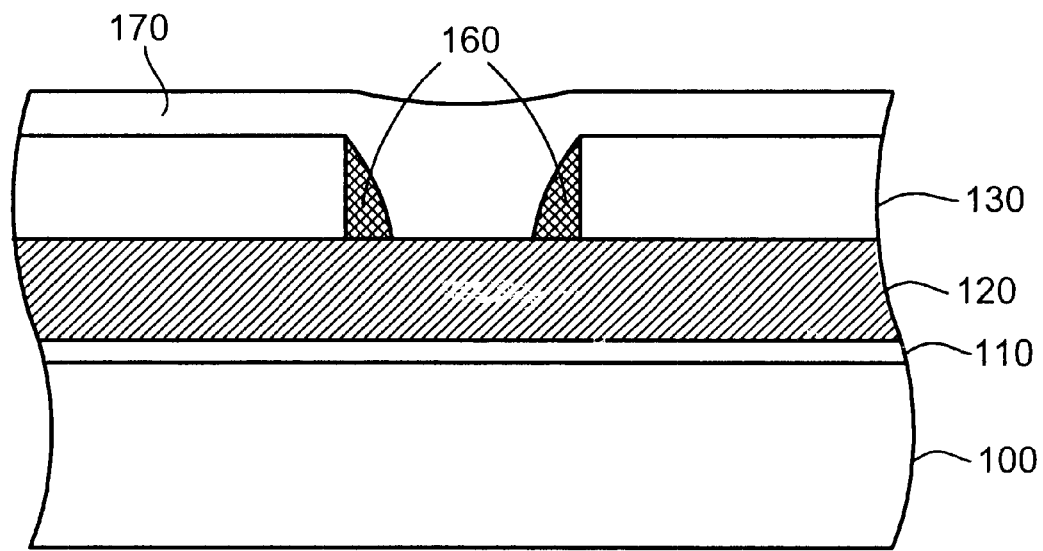
FIG. 6 illustrates a cross-sectional view of forming an insulating layer in accordance with the present invention.
Figure 7:
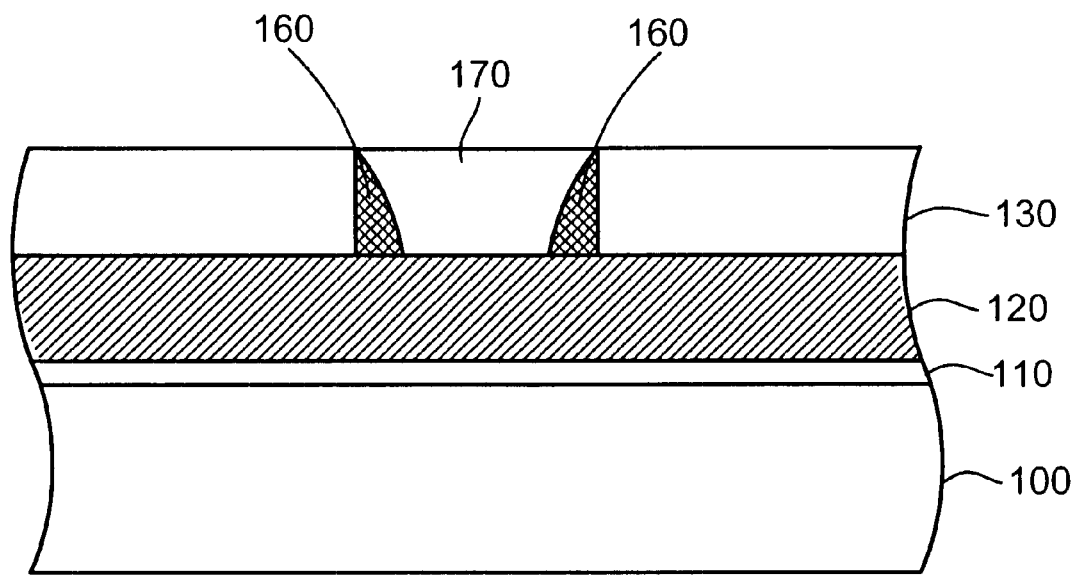
FIG. 7 illustrates a cross-sectional view of planarizing the insulating layer in accordance with the present invention.
Figure 8:
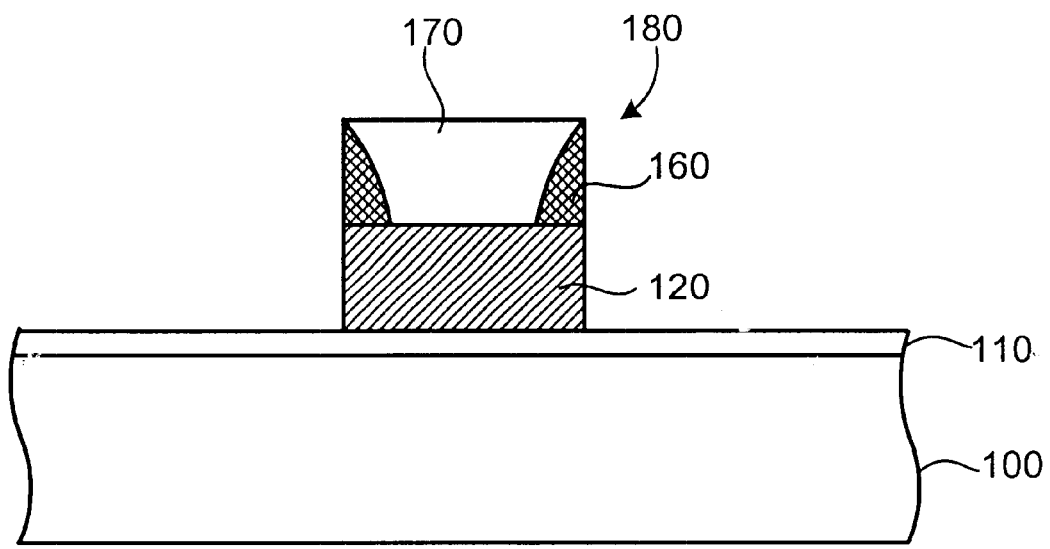
FIG. 8 illustrates a cross-sectional view of forming a floating gate in accordance with the present invention.

Referring to FIGS. 6 and 7, an insulating layer 170, such as an oxide layer (or a silicon oxide layer), is formed on the nitride layer 130 to cover the opening 140. Then, the oxide layer 170 is planarized to expose the nitride layer 130 by chemical mechanical polishing process. Then, by using the oxide layer 170 as a mask, the nitride layer 130 and the first polysilicon layer 120 are etched to form a floating gate structure 180, as shown in FIG. 8. Because the oxide layer 170 has an etching selectivity between the nitride layer 130 and the polysilicon layer 120, no extra photolithography process is necessary to form the floating gate structure 180.

Figure 9:
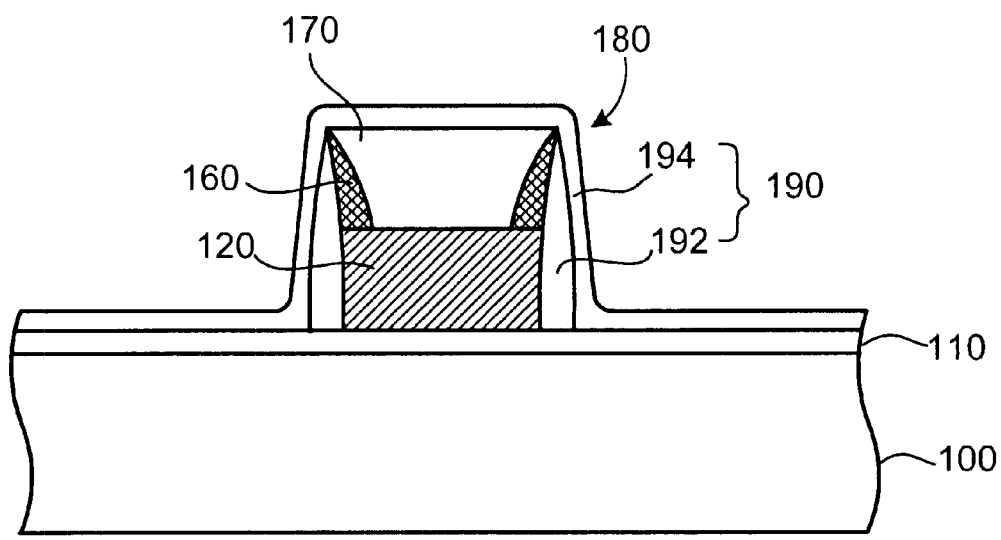
FIG. 9 illustrates a cross-sectional view of forming an interpoly oxide layer in accordance with the present invention.
Figure 10:
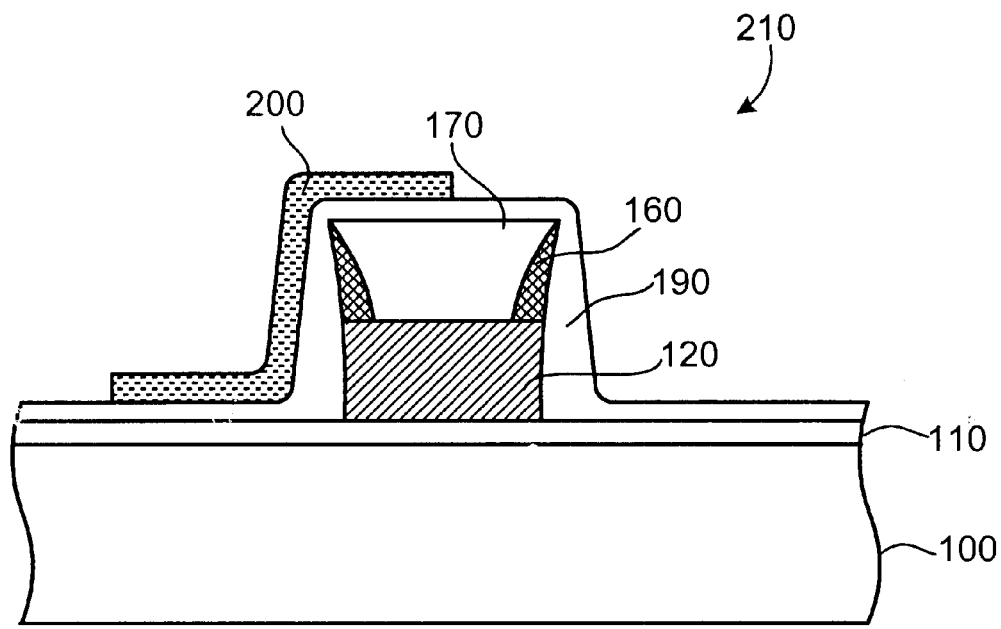
FIG. 10 illustrates a cross-sectional view of a split-gate flash memory of the present invention.

Referring to FIG. 9, the method further includes the step of forming an interpoly oxide layer 190 on the floating gate structure 180. The formation of the interpoly oxide layer 190 includes the step of thermal oxidizing the floating gate 180, and as a result, the polysilicon at the sidewall of floating gate 180 is oxidized to form a high temperature oxide layer 192 of oblong shape. Therefore, the poly spacer is sharpened. Then, an oxide layer 194 is deposited on the floating gate 180 to prevent the leakage current. Additionally, the method further includes the step of forming a nitride spacer (not shown) on the sidewall of the floating gate 180, which is covered with the interpoly oxide layer 190, to enhance the prevention of the leakage current. Referring to FIG. 10, the method further includes the step of forming a second poly layer 200 over the silicon substrate 100. The second poly layer 200 is patterned to form a control gate structure of a split-gate flash memory 210.

Although specific embodiments have been illustrated and described, it will be obvious to those skilled in the art that various modifications may be made without departing from what is intended to be limited solely by the appended claims.

What is claimed is:

1. A method of forming a floating gate with a poly tip, comprising:

providing a semiconductor substrate;

forming a gate dielectric layer on said semiconductor substrate;

forming a first poly layer on said gate dielectric layer;

forming a hard mask layer on said first poly layer;

forming an opening in said hard mask layer to expose a portion of said first poly layer;

forming a poly spacer in said opening; and removing said hard mask layer and said first poly layer thereunder to form said floating gate.

2. The method according to claim 1, wherein said step of forming said opening comprises:

forming a patterned photoresist layer on said hard mask layer to define said opening;

etching said hard mask layer to expose said first poly layer by using said patterned photoresist as a mask; and removing sail patterned photoresist layer.

3. The method according to claim 1, wherein said step of forming said poly spacer in said opening comprises:

forming a second poly layer on said hard mask layer; and etching said second poly layer to form said poly spacer.

4. The method according to claim 1, wherein said step of removing said hard mask layer and said first poly layer thereunder comprises:

forming an insulating layer on said hard mask layer to cover said opening;

planarizing said insulating layer to expose said hard mask layer; and etching said hard mask layer and said first poly layer by using said insulating layer as a mask.

5. The method according to claim 4, wherein said insulating layer comprises an oxide layer.

6. The method according to claim 4, further comprising thermal oxidizing said first poly layer and said poly spacer to form an interpoly oxide layer and sharpen said poly spacer.

7. The method according to claim 6, further comprising forming a control gate layer to form a split-gate flash memory.

8. The method to claim 1, further comprising forming an interpoly insulating layer and a control gate layer to form a split-gate flash memory.

9. The method according to claim 8, wherein said step of forming said interpoly oxide layer comprises:

thermal oxidizing said floating gate to sharpen said poly spacer; and depositing an oxide layer on said floating gate.

10. The method according to claim 1, wherein said semiconductor substrate comprises a silicon layer.

11. The method according to claim 1, wherein said gate dielectric layer comprises a gate oxide layer.

12. The method according to claim 1, wherein said hard mask layer comprises a silicon nitride layer.

13. A method of forming a floating gate with a poly tip, comprising:

providing a silicon substrate;

forming a gate oxide layer on said silicon substrate;

forming a first poly layer on said gate oxide layer;

forming a nitride layer on said first poly layer;

forming a patterned photoresist layer, defining an opening, on said nitride layer;

etching said nitride layer, using said patterned photoresist layer as a mask, to form said opening in said nitride layer and to expose said first poly layer;

removing said patterned photoresist;

forming a conformal poly layer on said nitride layer;

etching said conformal poly layer to form a poly spacer in said opening;

forming an oxide layer on said nitride layer to cover said opening;

chemical mechanical polishing said oxide layer to expose said nitride layer; and etching said nitride layer and said first poly layer, using said oxide layer as a mask, to form said floating gate.

14. The method according to claim 13, further comprising thermal oxidizing said first poly layer and said poly spacer to form an interpoly oxide layer and sharpen said poly spacer.

15. The method according to claim 14, further comprising forming a poly control gate layer of a split-gate flash memory.

16. A method of forming a poly tip in a split gate memory, comprising:

providing a silicon substrate;

forming a gate oxide layer on said silicon substrate;

forming a first poly layer on said gate oxide layer;

forming a nitride layer on said first poly layer;

forming a patterned photoresist layer, defining an opening, on said nitride layer;

etching said nitride layer, using said patterned photoresist layer as a mask, to form said opening in said nitride layer and to expose said first poly layer;

removing said patterned photoresist;

forming a conformal poly layer on said nitride layer; etching said conformal poly layer to form a poly spacer in said opening;

forming an oxide layer on said nitride layer to cover said opening;

chemical mechanical polishing said oxide layer to expose said nitride layer;

etching said nitride layer and said first poly layer, using said oxide layer as a mask, to form a floating gate structure;

forming an interpoly oxide layer on said floating gate structure; and forming a second poly layer over said silicon substrate and patterning said second poly layer to form a control gate structure of said split-gate flash memory.

17. The method according to claim 16, wherein said step of forming said interpoly oxide layer comprises:

thermal oxidizing said floating gate structure to sharpen said poly spacer; and forming a deposition oxide layer on said floating gate structure.

* * * * *